(12) United States Patent
Bonstrom et al.

(10) Patent No.: US 6,327,143 B1
(45) Date of Patent: Dec. 4, 2001

(54) RADIAL COMPUTER SYSTEM AND METHOD

(75) Inventors: Paul Bonstrom, Eau Claire; Gary Shorrel, Chippewa Falls; Dale Sand, Eau Claire, all of WI (US)

(73) Assignee: Cray, Inc., Mendota Heights, MN (US)

( * ) Notice: Subject to any disclaimer, the term of this patent is extended or adjusted under 35 U.S.C. 154(b) by 0 days.

(21) Appl. No.: 09/434,833

(22) Filed: Nov. 5, 1999

(51) Int. Cl.⁷ ...................................................... G06F 1/16
(52) U.S. Cl. ........................... 361/683; 361/679; 361/686
(58) Field of Search .................................. 361/679, 683, 361/686

(56) References Cited

U.S. PATENT DOCUMENTS 5,150,279 * 9/1992 Collins et al. ........................ 361/393

* cited by examiner

Primary Examiner—Gerald Tolin
Assistant Examiner—Yean-Hsi Chang
(74) Attorney, Agent, or Firm—Schwegman, Lundberg, Woessner & Kluth, P.A.

(57) ABSTRACT

This invention relates to computer systems and hardware, and in particular to a radial computer system, hardware for building a radial computer system and a method for building a radial computer system. According to one aspect of the invention, a clustering concept for a scalable computer system includes computer elements aligned by a joiner into an arc shaped configuration. The radial configuration of the cluster and associated hardware provide a computer system that reduces high speed cable lengths, provides additional connection points for the increased number of cable connections, provides electromagnetic interference shielding, and provides additional space for cooling hardware. These features result in an improved scalable computer system.

26 Claims, 15 Drawing Sheets

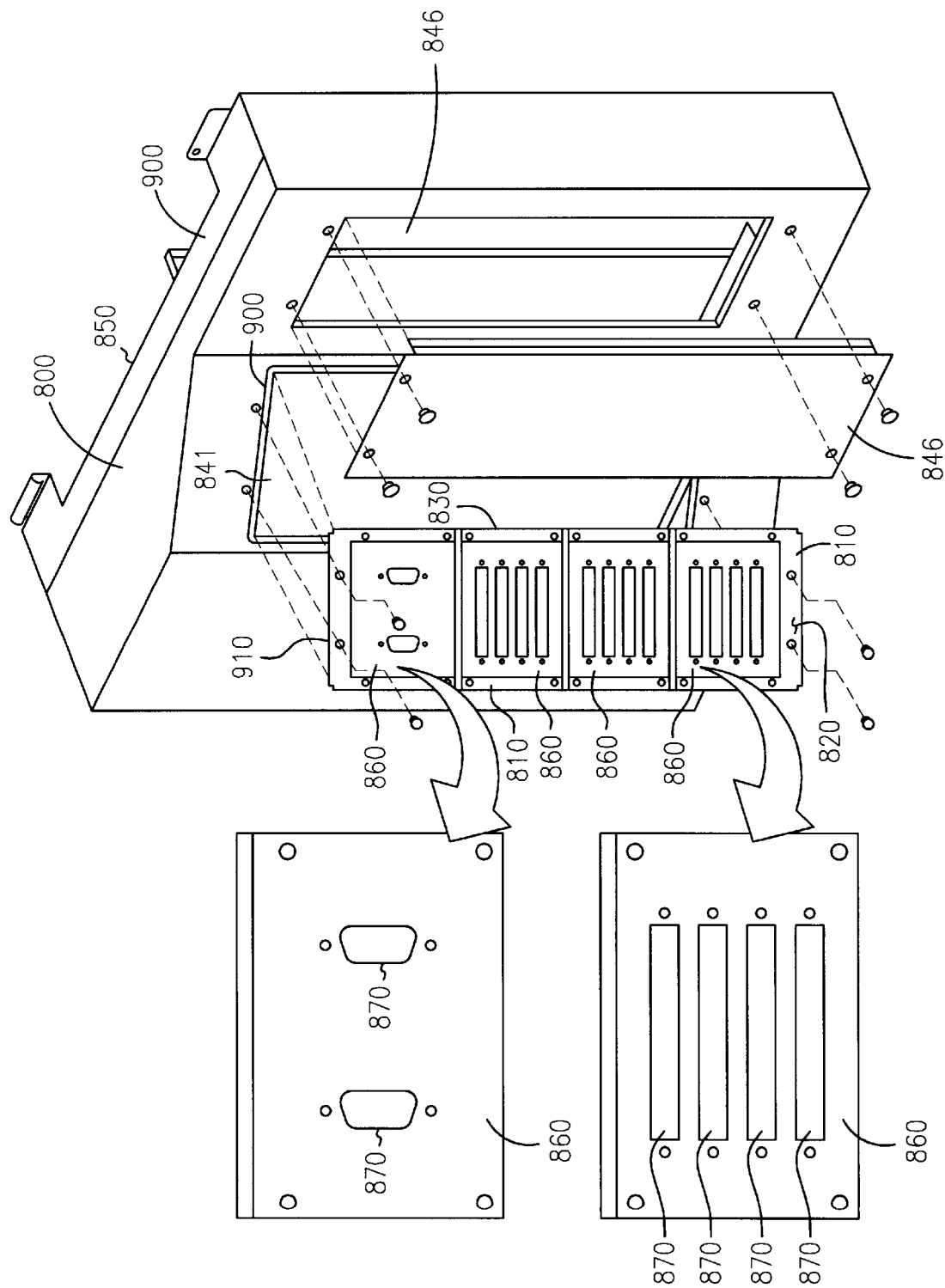

RADIAL COMPUTER SYSTEM AND METHOD

FIELD OF INVENTION

This invention relates to computer systems and hardware, and in particular to a radial computer system, hardware for building a radial computer system and a method for building a radial computer system.

BACKGROUND

Scalable computer systems typically have an increased number of computer elements which typically require a greater number of cable connections within the computer system. Scalable computer systems typically also require longer cable lengths. Cables are typically expensive high frequency cables. The performance of the computer system may be degraded by increased cable lengths and an increased number of connections causing additional electromagnetic interference. In some cases, scalable computer systems also require additional cooling hardware beyond what has been used in the past to keep the larger number of computer elements at the appropriate operating temperature. These factors make the building of scalable computer systems less desirable. As computer use grows and as the size of computer systems increase, new hardware and methods are needed to provide for the necessary cable connections between elements of the computer system and to provide for the additional cooling hardware required by the larger systems.

DISCLOSURE OF INVENTION

According to one aspect of the invention, a plurality of computer elements are aligned by joiners so that the computer elements form an arc with an inner radius and an outer radius. The radial alignment maintains minimal space between computer elements along the inner radius of the arc and increases space between computer elements toward the outer radius of the arc. According to one aspect of the invention, high frequency cables are routed from element to element through the joiner proximal the inner radius of the arc. According to another aspect of the invention, at least one bulkhead is mounted in the space between the computer elements distal from the inner radius of the arc but within the outer radius of the arc. The bulkhead includes a plate for receiving cable connections on each side of the plate. According to another aspect of the invention, both the joiner and the bulkhead include features for providing electromagnetic interference shielding.

The radial configuration of the cluster and the radial hardware resolve problems typically associated with scalable computer systems, providing a computer system that reduces high speed cable lengths, provides additional connection points for the increased number of cable connections, provides electromagnetic interference shielding, and provides additional space for cooling hardware. These features result in an improved scalable computer system. The various embodiments of the invention provide a radial computer system, hardware for a radial computer system and a method for building a radial computer system

DESCRIPTION OF EMBODIMENTS

In the following detailed description of the preferred embodiments, reference is made to the accompanying drawings that form a part hereof, and in which is shown by way of illustration specific embodiments in which the invention may be practiced. It is to be understood that other embodiments may be utilized and structural changes may be made without departing from the scope of the present invention.

Figure 1:
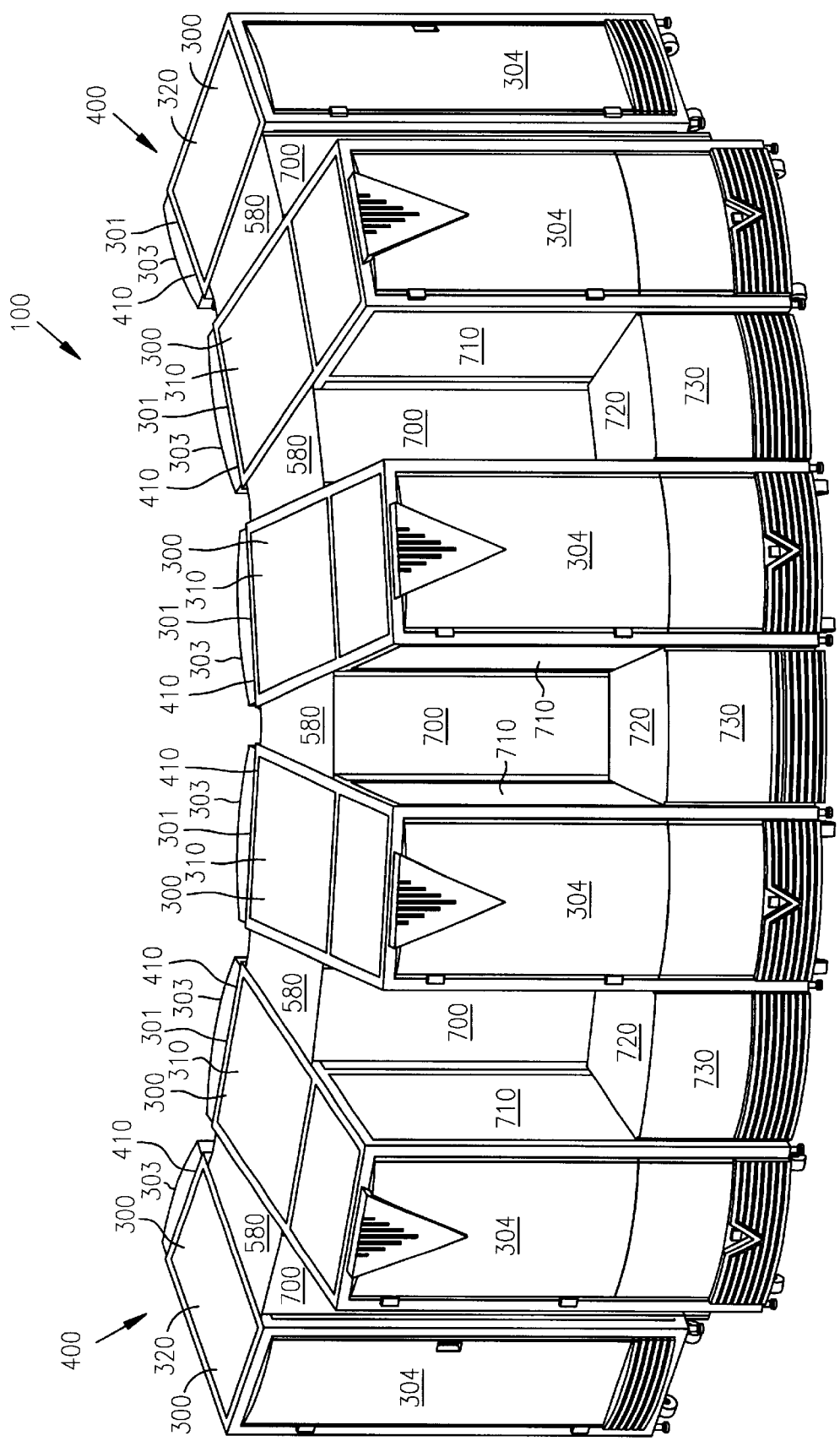
FIG. 1 is an isometric view of an embodiment of a radial cluster.

FIG. 1 is an embodiment of a clustering concept for a scalable computer system. The radial configuration of the cluster 100 and the radial hardware resolve problems typically associated with scalable computer systems, providing a computer system that reduces high speed cable lengths, provides additional connection points for the increased number of cable connections, provides electromagnetic interference (EMI) shielding, and provides additional space for cooling hardware. These features result in an improved scalable computer system.

The cluster 100 shown in FIG. 1 includes computer elements 300 aligned by joiners 500 between each of the computer elements 300 so that the computer elements 300 are arranged in an arc 400. The arc 400 formed by the radially aligned computer elements 300 has an inner radius 410 defined by the rear face 301 of the computer elements 300 and an outer radius 420 defined by the front face 302 of the computer elements 300. In one embodiment, the computer elements 300 consist of four mainframe "processing nodes" 310 centrally located and aligned relative to one another by a joiner 500 between each processing node 310, a first outer I/O cabinet 320 and a second outer I/O cabinet 320 are also aligned by a joiners 500.

The radial configuration reduces the length of the high frequency cabling 200 by allowing passage of the cabling 200 through the joiner 500 proximal the inner radius 410 of the cluster 100 while increasing space for additional high frequency cable connections and cooling hardware between the elements, thus improving the layout of the computer system and improving the use of available floor space.

In one embodiment, the computer elements 300 include a rear access door 303 on the rear face 301. The computer elements 300 are arranged so that the rear access doors can swing open without interfering with the access provided through rear access doors 303 on adjacent computer element. In another embodiment, each element includes a front access door 304 on the front face 302.

Figure 2:
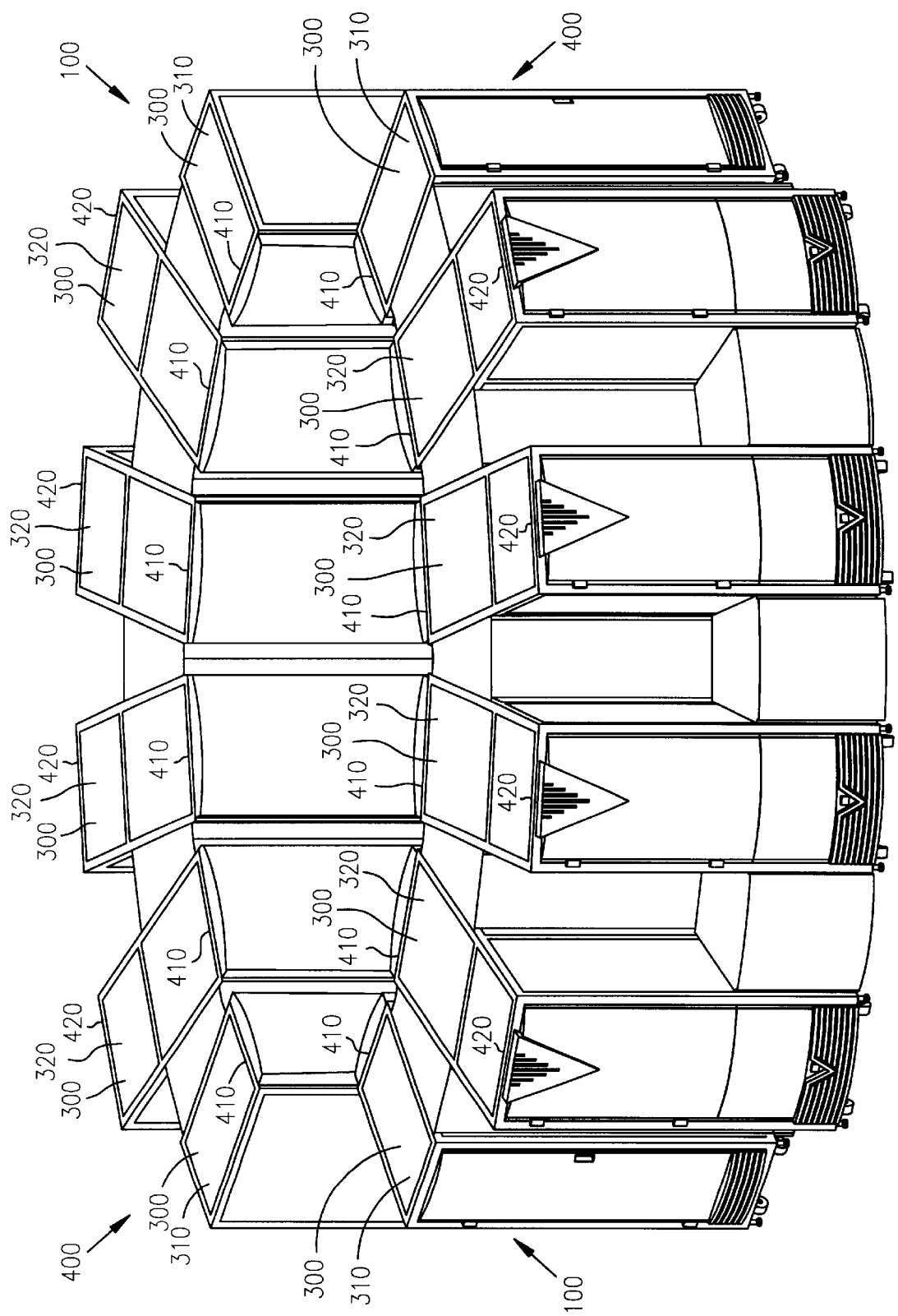
FIG. 2 is an isometric view of an embodiment of a computer system including a first and second radial cluster.
Figure 3:
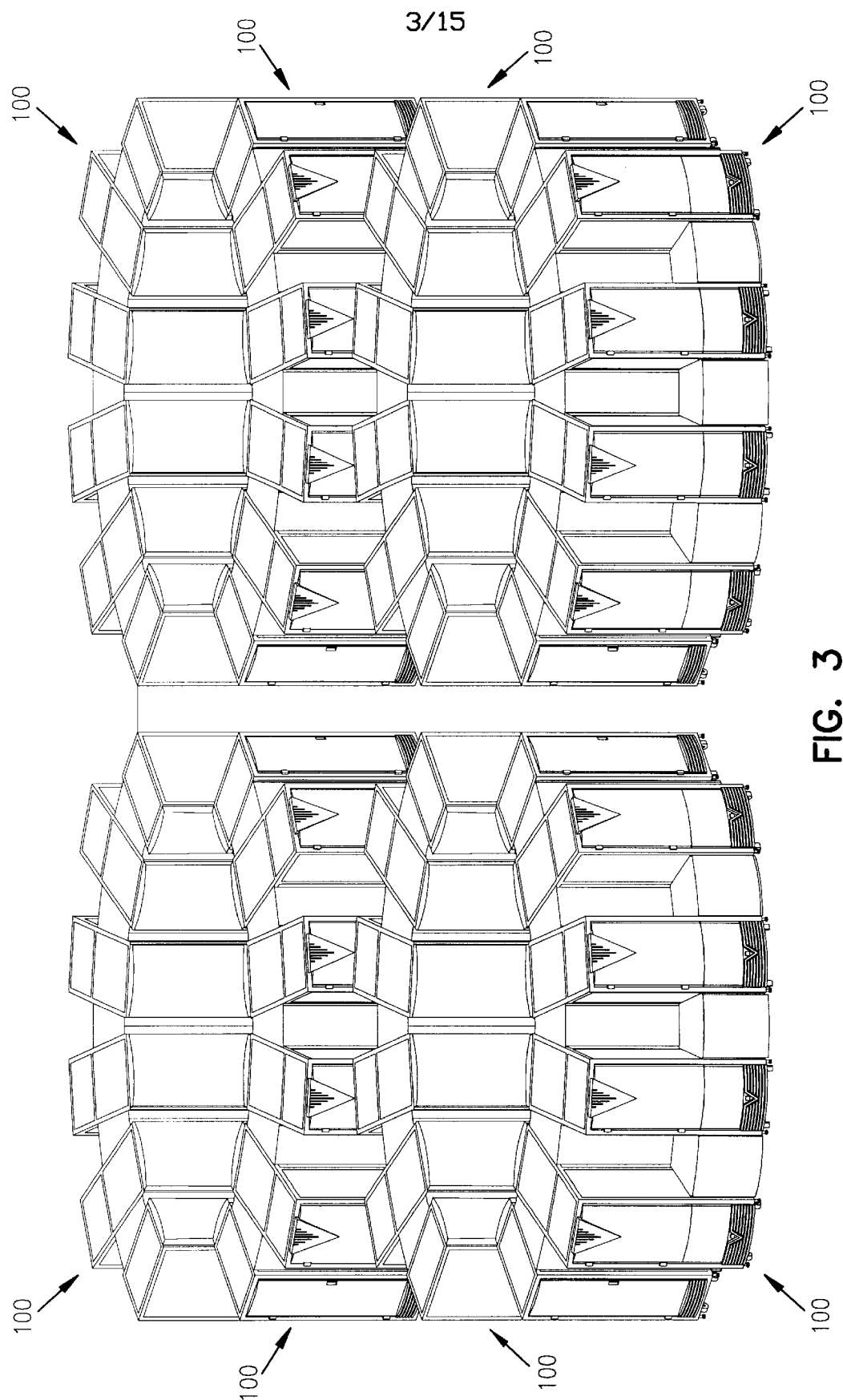
FIG. 3 is an isometric view of an embodiment of a computer system including eight radial clusters.

FIG. 2 is an embodiment of a radial configuration scaled to include two clusters 100 back-to-back. The first cluster 100 is spaced from the second cluster 100 to allow for service space between each cluster 100. The space between clusters 100 also improves ventilation and cooling. FIG. 3 is an embodiment of a radial configuration scaled to include eight clusters 100, illustrating that the system can be scaled to larger and larger degrees while maintaining the aforementioned benefits.

In one embodiment, each cluster 100 provides an EMI tight environment. Each processing node 310 includes EMI shielding. The radial hardware joining each processing node 310 includes features to extend the EMI shielding outside of the processing node 310 to protect cables 200 passing from processing node 310 to processing node 310 through the joiner 500.

Figure 4:
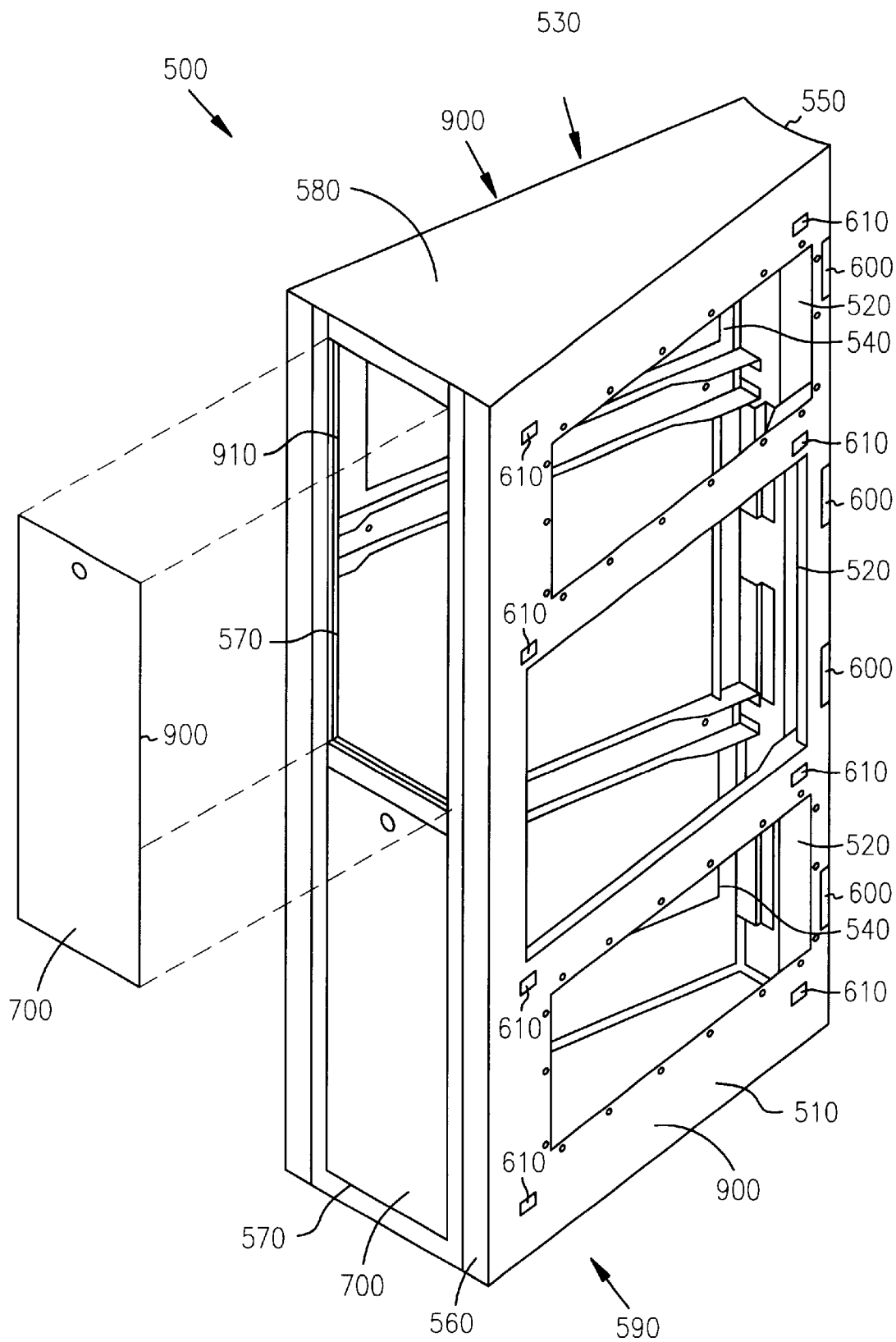
FIG. 4 is a view of an embodiment of a joiner and joiner access panel.

FIG. 4 is an embodiment of a joiner 500 for aligning computer elements 300. The joiner 500 includes a first surface 510 for aligning a first computer element 300, and at least one passage 520 for aligning with a passage on the first computer element 300 and for allowing passage of a high frequency cable between the joiner 500 and the first element 300. Similarly, the joiner 500 includes a second surface 530 for aligning a second computer element 300, and at least one passage 540 for aligning with a passage in the second computer element 300 and for allowing passage of a high frequency cable between the joiner 500 and the second element 300. The joiner 500 also includes a rear surface 550 and a front surface 560, having a larger width than the rear surface 550. The front surface 560 joins the front end of the first surface 510 and the front end of the second surface 530. The result is that the joiner 500 aligns the first and second computer components at an angle relative to one another. The joiner 500 also includes a top surface 580 and a bottom surface 590.

In one embodiment, the rear access door 303 on a computer element 300, the side passages on the computer element 300, the side passages 520, 540 on the joiner 500 and the side passage on the adjacent computer element 300 provide access to components in the adjacent computer element 300, also improving ease of service.

Figure 8:
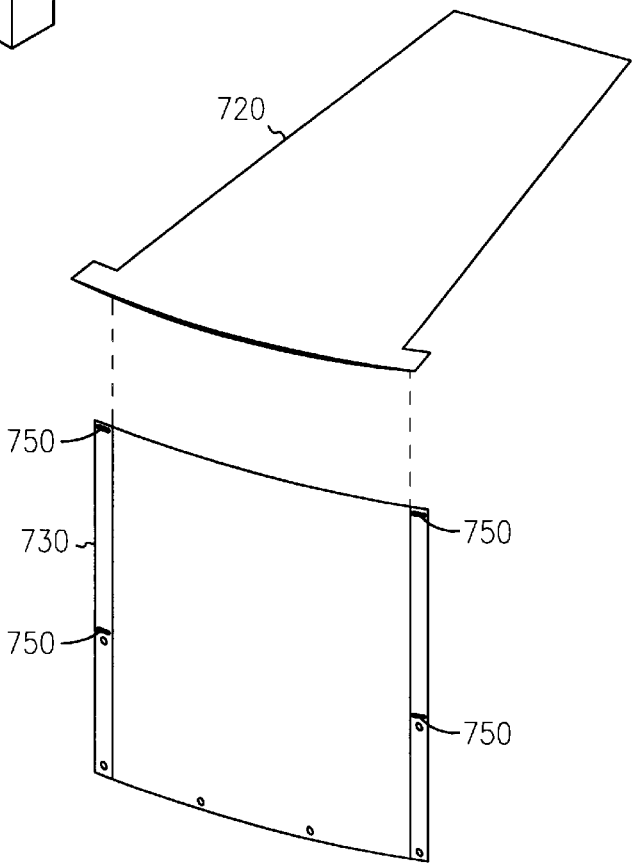
FIG. 8 is a view of an embodiment of a first and second seat access panel.

FIG. 4 illustrates one embodiment of a joiner 500 also including at least one front passage 570 for providing access to the high frequency cables 200 routed through the joiner 500. In one embodiment, the front passage 570 is covered by a joiner access panel 700 removably attached to the front surface 560. In one embodiment, the joiner access panel 700 attaches with a snap-like fit to the joiner 500. Tabs or detents 740 (see FIG. 5) on the joiner 500 are shaped to be received by a mating feature such as a slot or inward embossment 750 (see FIG. 8) on the joiner access panel 700 having a snug fit with the tabs or detents 740 such that the panels are retained until manually removed.

In one embodiment, the joiner 500 includes features for EMI shielding. The first side and second side of the joiner 500 include EMI compatible plating 900 for making contact with EMI gaskets 910 on the side of the first computer element 300 and on the side of the second computer element 300 respectively. The area surrounding the front passage 570 of the joiner 500 also includes EMI gasketing 910 for making contact with a plated surface 900 on the inside of the joiner access panel 700. This provides EMI shielding for the cables 200 passing from processing node 310 to processing node 310 through the joiner 500 and provides EMI shielding to cables 200 outside of the joiner 500.

In one embodiment, the joiner 500 includes at least one flange 600 extending out from the conrer of the joiner 500 where the first surface 510 meets the rear surface 550, and at least one flange 600 extending out from the corner of the joiner 500 where the second surface 530 meets the rear surface 550. The flanges are for hooking into slots within the first computer element 300 and the second computer element 300 respectively. The flanges 600 help to align the rear surface 550 of the joiner 500 with the rear surface 301 of the first and second computer element 300. The flanges 600 also help to align the first side of the joiner 500 with the side of the first computer element 300. This serves to align joiner apertures 610 on the joiner 500 and computer element 300 for improved ease of installation of mechanical fasteners securing the joiner 500 to the computer element 300.

In one embodiment, the joiner 500 is supported off the ground by the attachment to the computer element 300. In another embodiment, the joiner 500 is supported on casters and includes levelers for aiding in alignment during installation. In one embodiment, the joiner 500 is the same height as the first computer element 300 and the second computer element 300 allowing for direct passage of cables 200 along the length of each unit.

FIG. 1 illustrates one embodiment in which the first computer element 300 and the second computer element 300 extend beyond the front surface 560 of the joiner 500. This provides room between the first element 300 and the second element 300 for additional radial hardware.

In one embodiment, the radial hardware includes additional components with EMI shielding for additional cable connections so that cable connections can be added without degradation in performance of the system due to electromagnetic interference.

Figure 5:
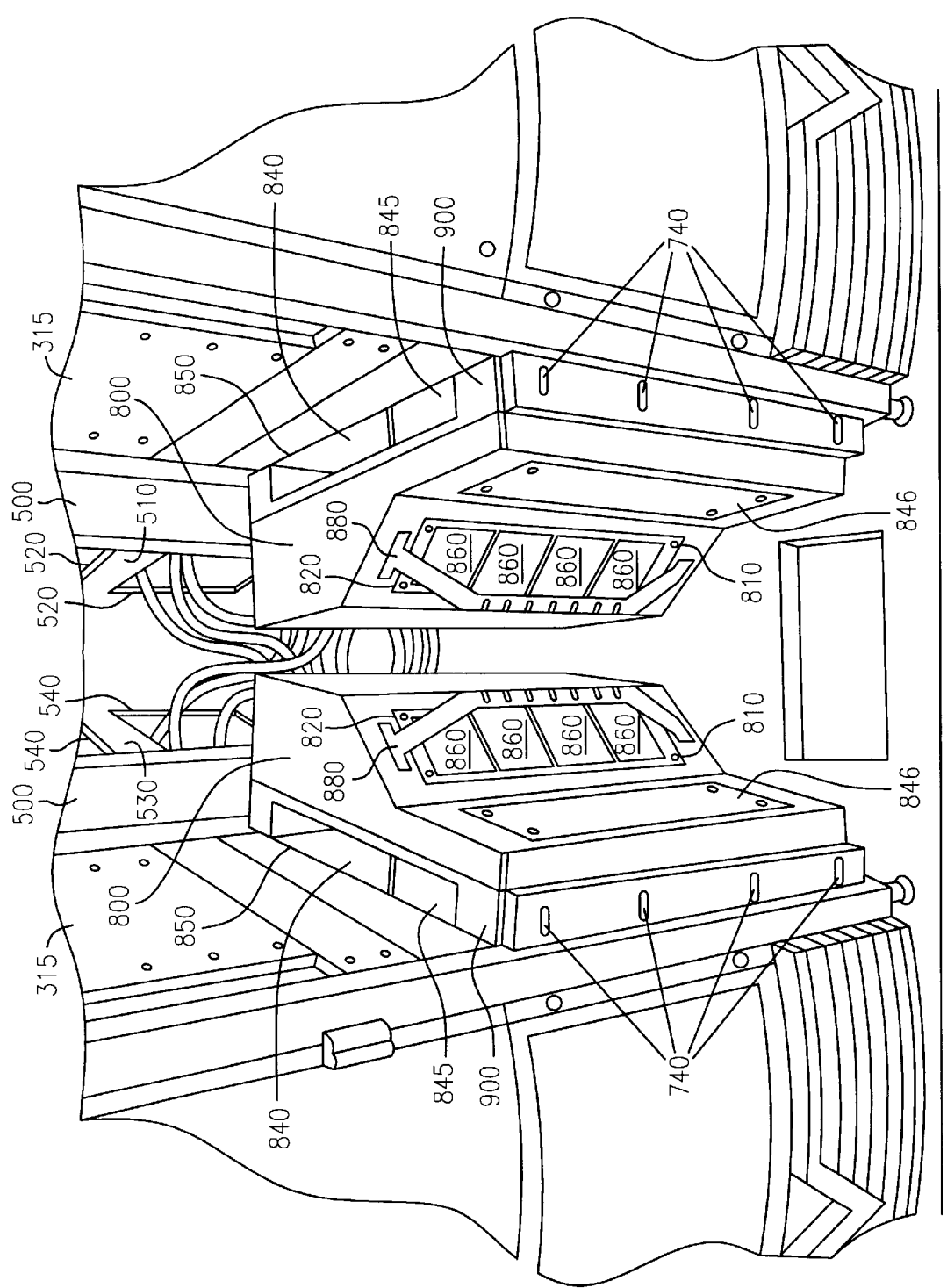
FIG. 5 is a view of an embodiment of a first and second bulkhead attached to the side of a computer.
Figure 6B:
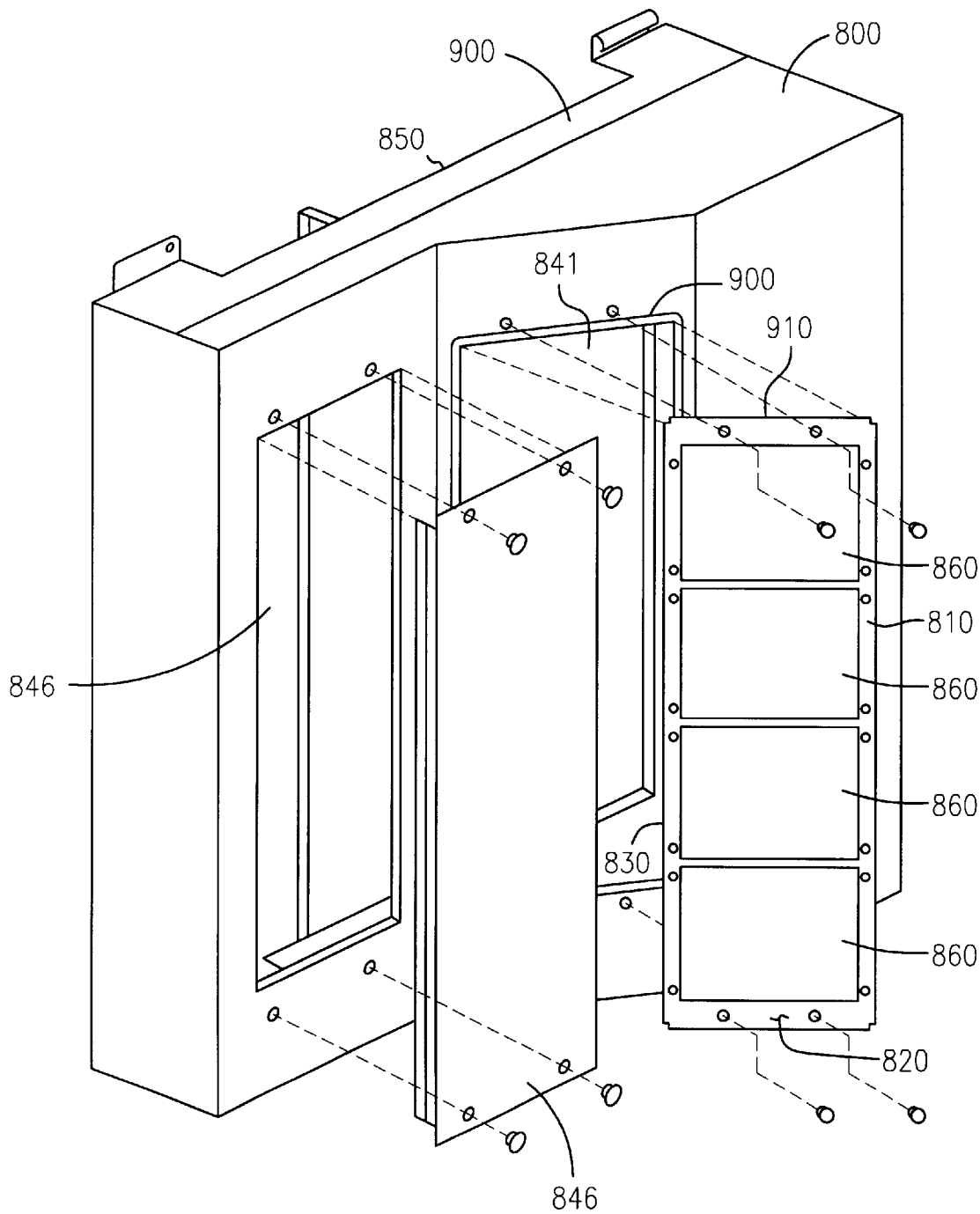
FIG. 6 is a view of an embodiment of a first and second bulkhead.

FIGS. 5 and 6 illustrate an embodiment in which the radial hardware includes a bulkhead 800 mounted to the side of the computer element 300. In one embodiment, the bulkhead 800 includes at least one main plate 810. The main plate 810 includes a front portion 820 and a rear portion 830 and a plate aperture 870 for allowing cables 200 on each side of the main plate 810 to connect. The mounted bulkhead 800 also includes an enclosed area 840 having a bulkhead passage 850 for allowing mainframe 310 cables 200 to enter the bulkhead 800 and to connect to the rear portion 830 of the main plate 810. In one embodiment, the mainframe 310 cables 200 are connected to the rear portion 830 of the main plate 810 with mechanical fasteners so that they are positioned to receive a connection with a cable at the front portion 820 of the main plate 810. In one embodiment, the main plate 810 on the bulkhead 800 is a removable main plate 810. In another embodiment, the main plate 810 includes about four smaller plates or "knockout" plates 860 assembled onto the main plate 810 so that the main plate 810 can be configured for an alternate sets of plate apertures 870 for receiving various types of cables 200. Each smaller plate 860 includes plate apertures 870 for allowing cables 200 attached to the rear portion 830 of the smaller plate 860 to connect with cables 200 mounted off the front portion 820 of the smaller plate 860.

Where no additional cable connections are required, the plates 810, 860 include no plate apertures 870. By mounting the bulkhead 800 to the side of the computer element 300, the joiner 500 access panel 700 may still be easily removed to provide access to the area within the joiner 500 without disturbing the bulkhead 800.

In one embodiment, the main plate 810 includes features for EMI shielding. The main plate 810 includes an edge gasket 910 around the inside surface of the main plate 810 for making contact with a plated surface 900 on the bulkhead 800. In an alternate embodiment, the smaller plate 860 includes an edge gasket 910 around the inside surface of the smaller plate 860 for making contact with a plated surface 900 on the main plate 810.

In one embodiment, the main plate 810 includes a cable support frame 880 for use in supporting the weight of the cable connected to the main plate 810. In one embodiment, the bulkhead 800 includes a cable support frame 880. In one embodiment, a cable support frame 880 is included within the enclosed area 840 of the bulkhead 800. In one embodiment, a cable support frame 880 is included on the outer portion of the bulkhead 800. In one embodiment, the cable support frame 880 includes support apertures 890 and 895, the support apertures 890 and 895 being used to secure the cable 200 to the support frame with a flexible cable support such as a velcro strap, twist tie, strap and buckle or other similar means. In an alternative embodiment, the cable may be secured to the cable support structure with a clip. FIGS. 15A, 15B, 15C and 15D provide an illustration of one embodiment of the cable support frame.

In one embodiment, the bulkhead 800 includes a second enclosed area 845 for element cooling hardware. The portion of the bulkhead 800 including the second enclosed area 845, also includes a cooling hardware access plate 846 for providing ease of access to the cooling hardware.

Figure 7:
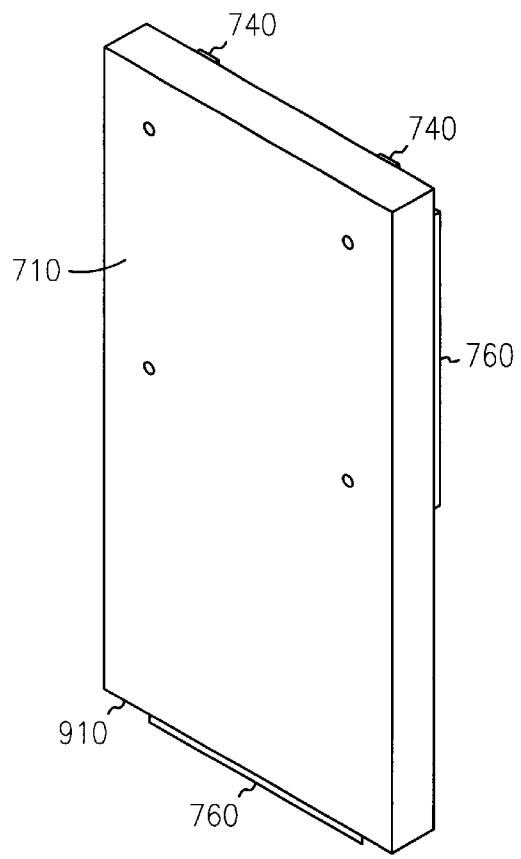
FIG. 7 is a view of an embodiment of a side cable panel.

FIG. 7 provides an illustration of one embodiment of a side cable panel 710. In one embodiment, the radial joining hardware includes a side cable panel 710 mounted over the bulkhead 800 cable passage 850 and over cables 200 routed along the side 315 of the mainframe 310 and entering the passage 850 to connect to the rear portion 830 of the main plate 810. The side cable panel 710 includes a side passage area for enclosing cables routed along the mainframe side 315 such that the side passage area on the side cable panel 710 aligns over the bulkhead cable passage. Cables routed along the side 315 of the mainframe 310 are enclosed within the side cable panel 710 and by the bulkhead 800 each mounted to the mainframe 310.

In one embodiment, the side cable panel 710 includes features for EMI shielding. In one embodiment the lower surface 760 of the side cable panel 710 includes an EMI gasket 910 for contacting a plated surface 900 on the bulkhead 800 surrounding the bulkhead 800 cable passage 850. In one embodiment, the side cable panel 710 includes panel flanges 760 for aligning with the bulkhead 800 passage 850 and for aligning with the side of the computer element 300. In one embodiment, the side cable panel 710 includes a snap-type mechanism for securing to the computer element 300. In one embodiment, tabs or detents 740 on the bulkhead 800 are shaped to be received by a mating feature such as a slot or inward embossment 750 having a snug fit with the tabs or detents 740 such that the panels can be manually removed.

In one embodiment, the bulkhead 800 is about half the height of the joiner 500 and the bulkhead 800 is enclosed by a first seat access panel 720 and a second seat access panel 730. The first seat access panel 720 abuts the joiner access panel 700, the side cable panel 710, and the second seat access panel 730. The second seat access panel 730 attaches with a snap-like fit to the bulkhead 800. Tabs or detents 740 on the bulkhead 800 are shaped to be received by a mating feature such as a slot or inward embossment 750 having a snug fit with the tabs or detents 740 such that the panels can be manually removed.

The result is a radial computer system that is easily scalable from a smaller system to a much larger system. The resulting computer system reduces the length of high frequency cabling 200 passing from processing node 310 to processing node 310 through the joiner 500 proximal the inner radius 410 of the cluster 100, while increasing the space for additional cable connections and for cooling hardware proximal the outer radius 420 of the cluster 100. This clustering concept and associated hardware improves the layout of the computer system and improve the use of available floor space. The radial hardware design includes features for EMI shielding for providing a scalable EMI tight environment.

Additionally, the radial configuration provides for service space between back-to-back clusters and provides for ease of scalability to much larger systems while maintaining the aforementioned benefits.

Figure 9:
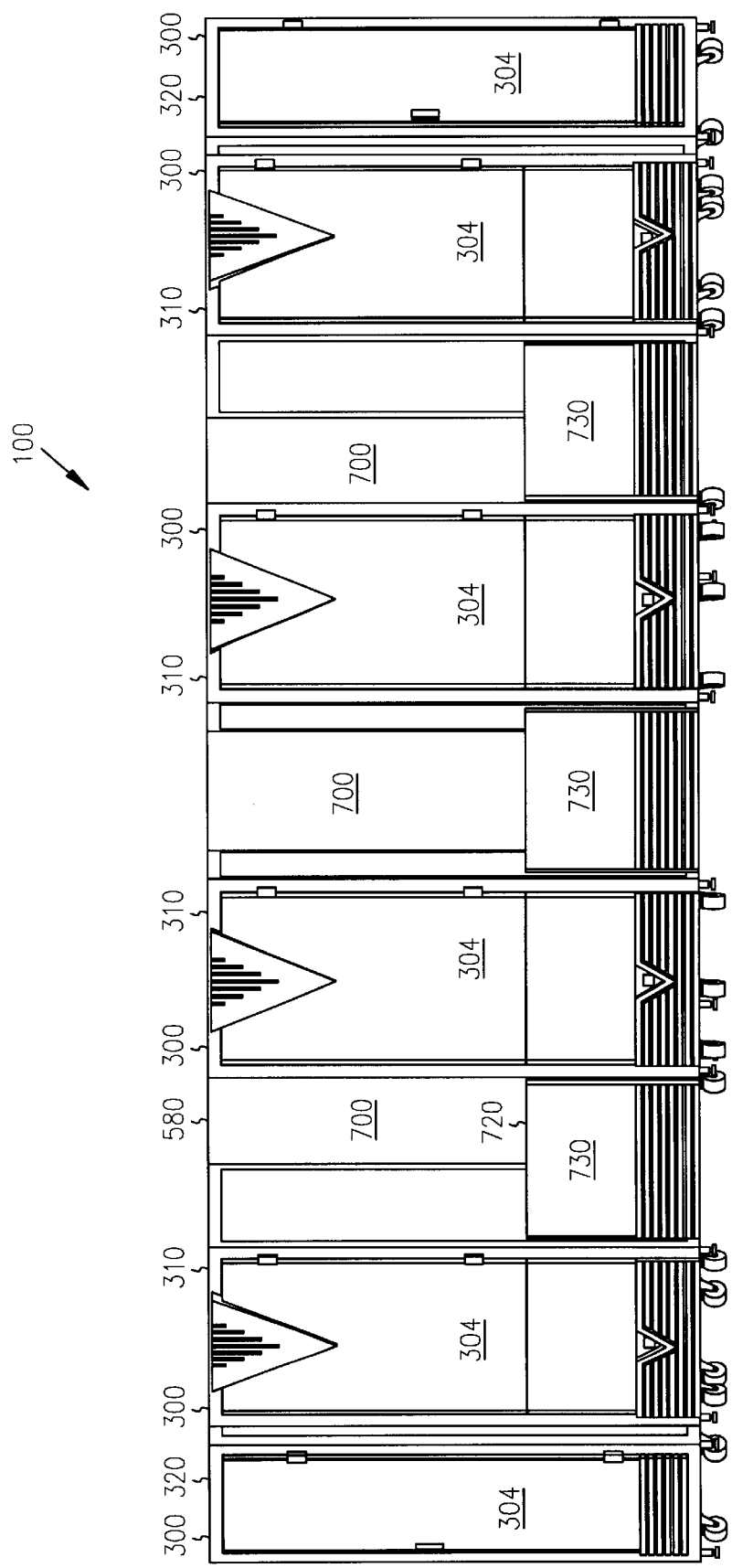
FIG. 9 is a front view of a radial cluster.
Figure 10:
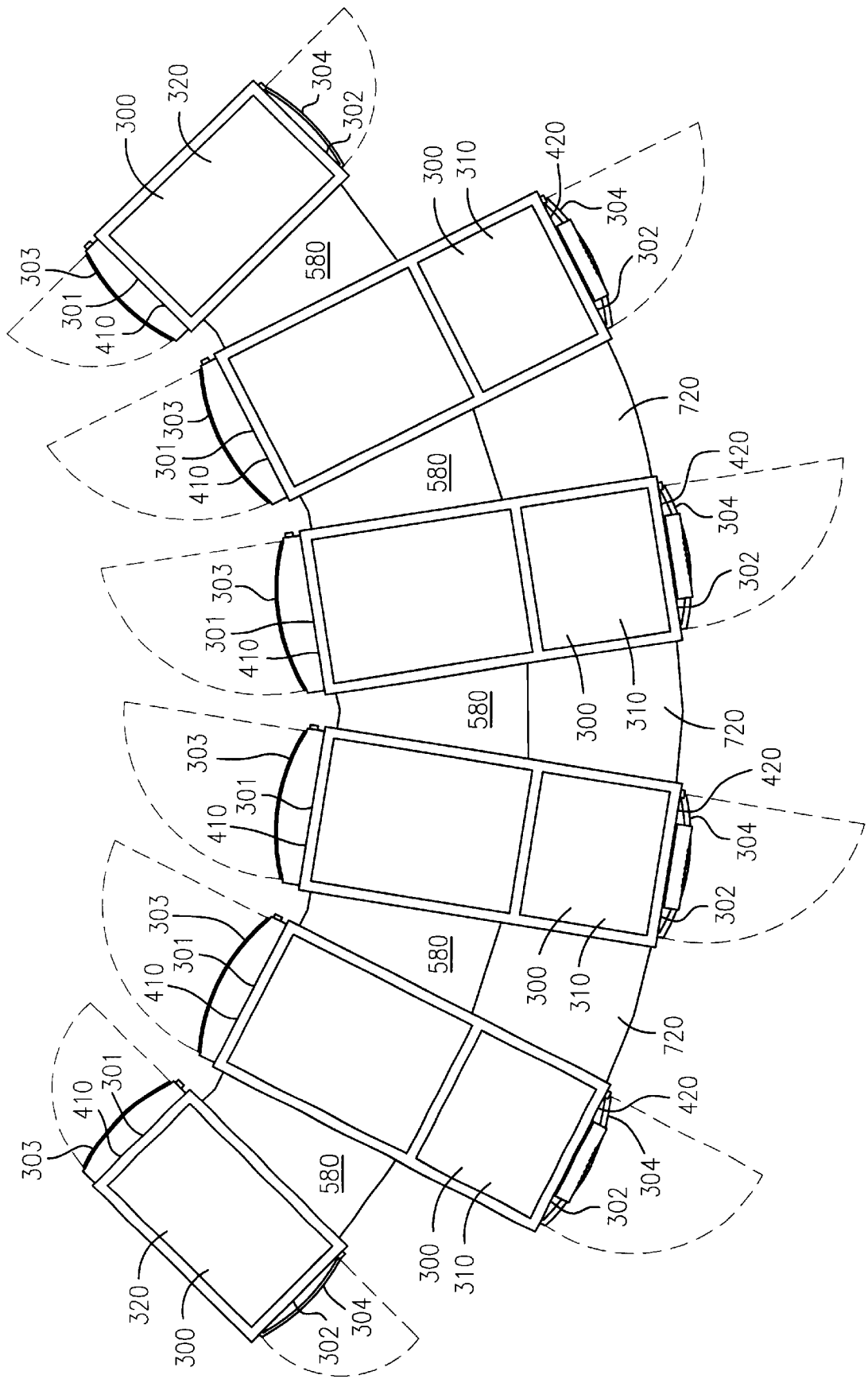
FIG. 10 is a top view of a radial cluster.
Figure 11:
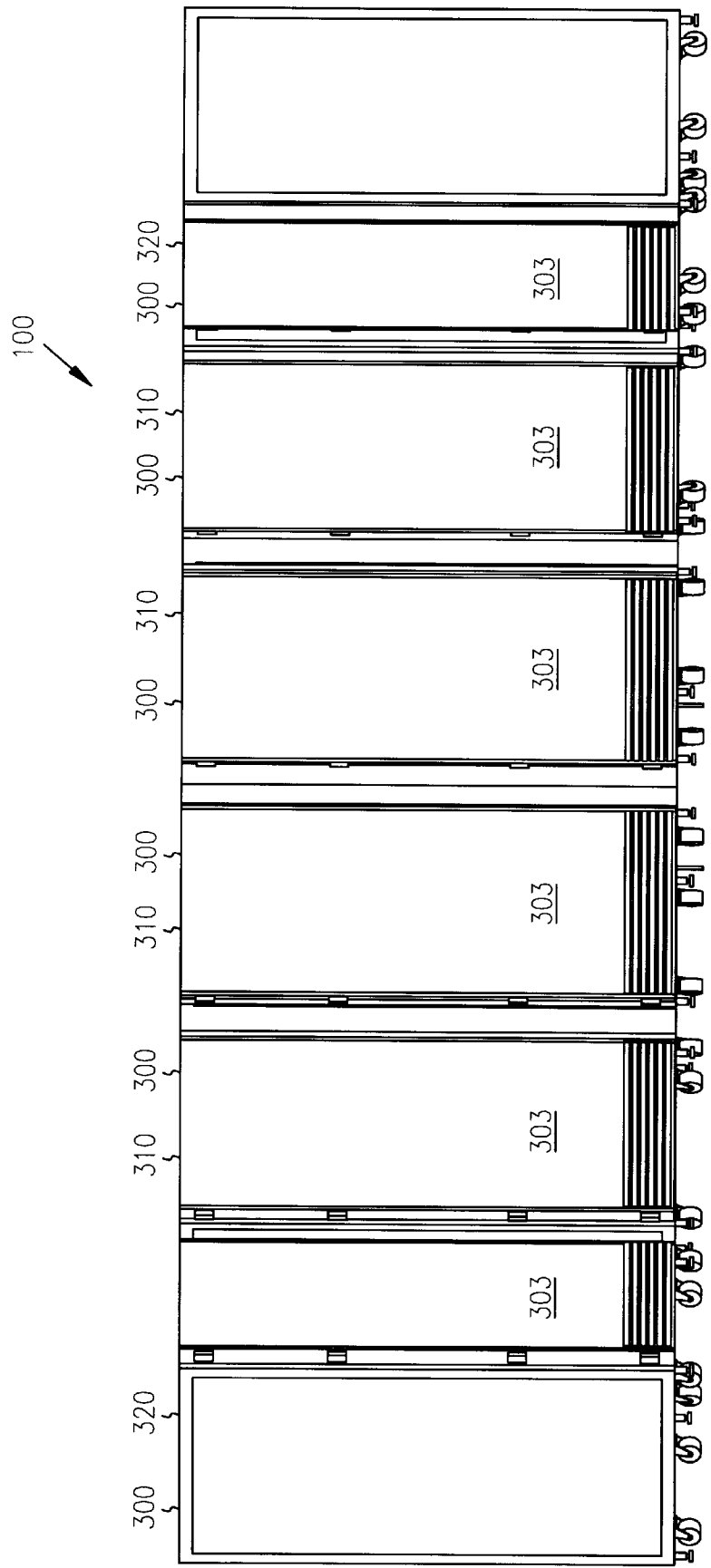
FIG. 11 is a rear view of a radial cluster.
Figure 12:
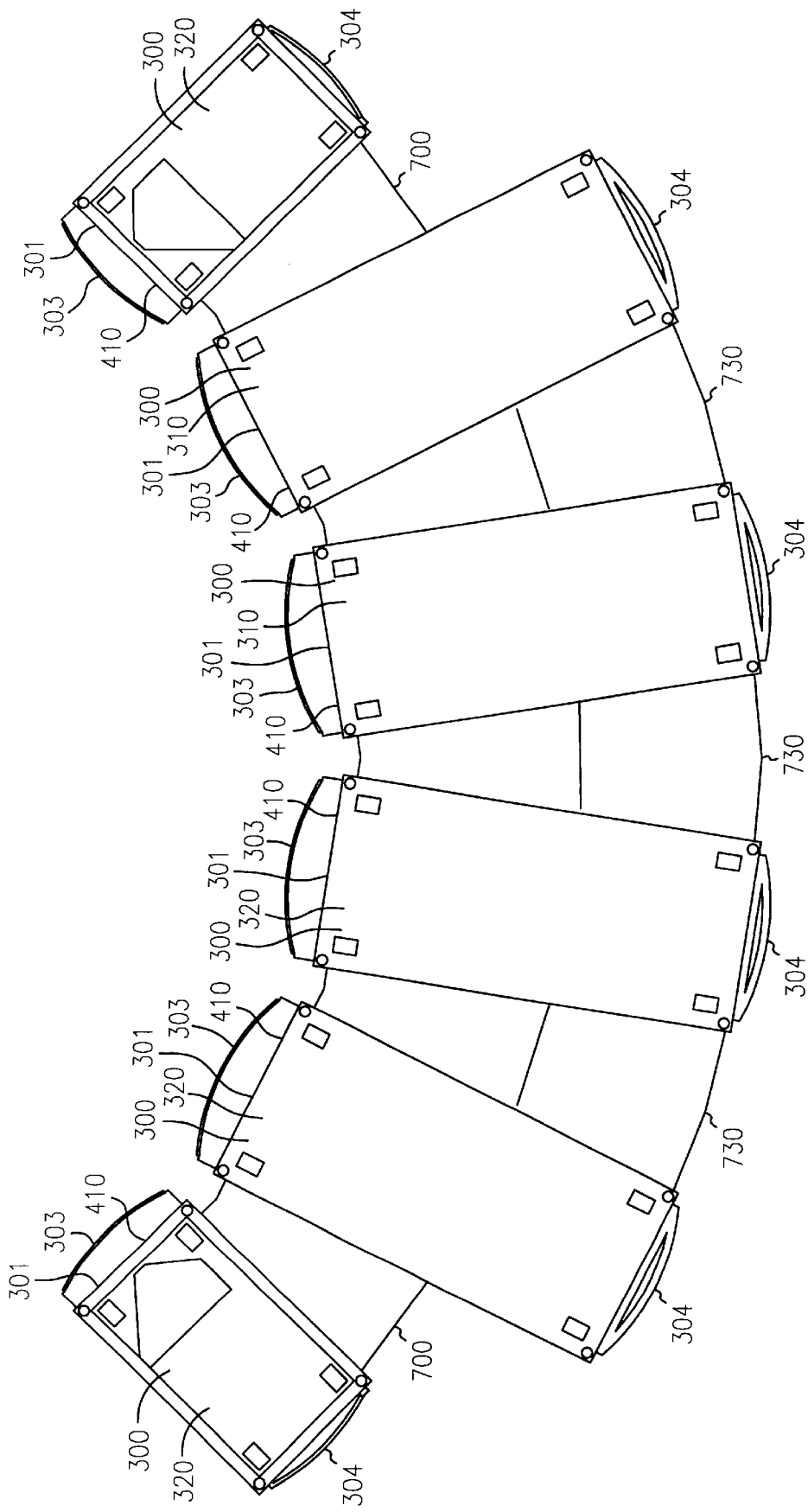
FIG. 12 is a bottom view of a radial cluster.
Figure 13:
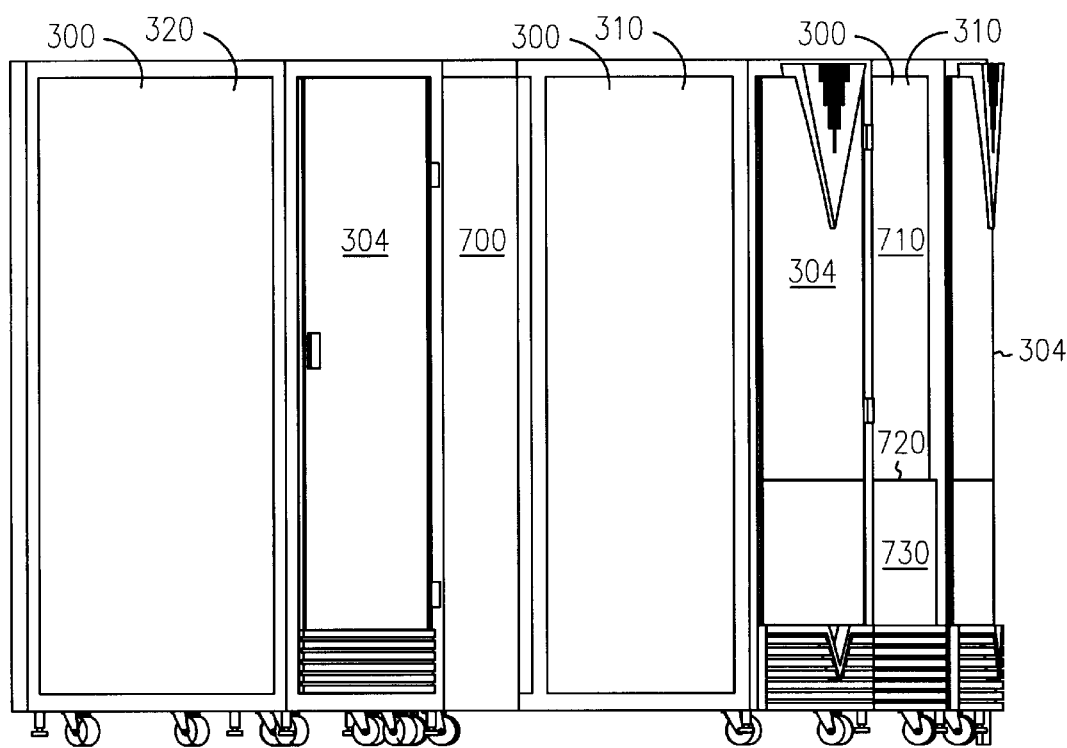
FIG. 13 is a side view of a radial cluster.
Figure 14:
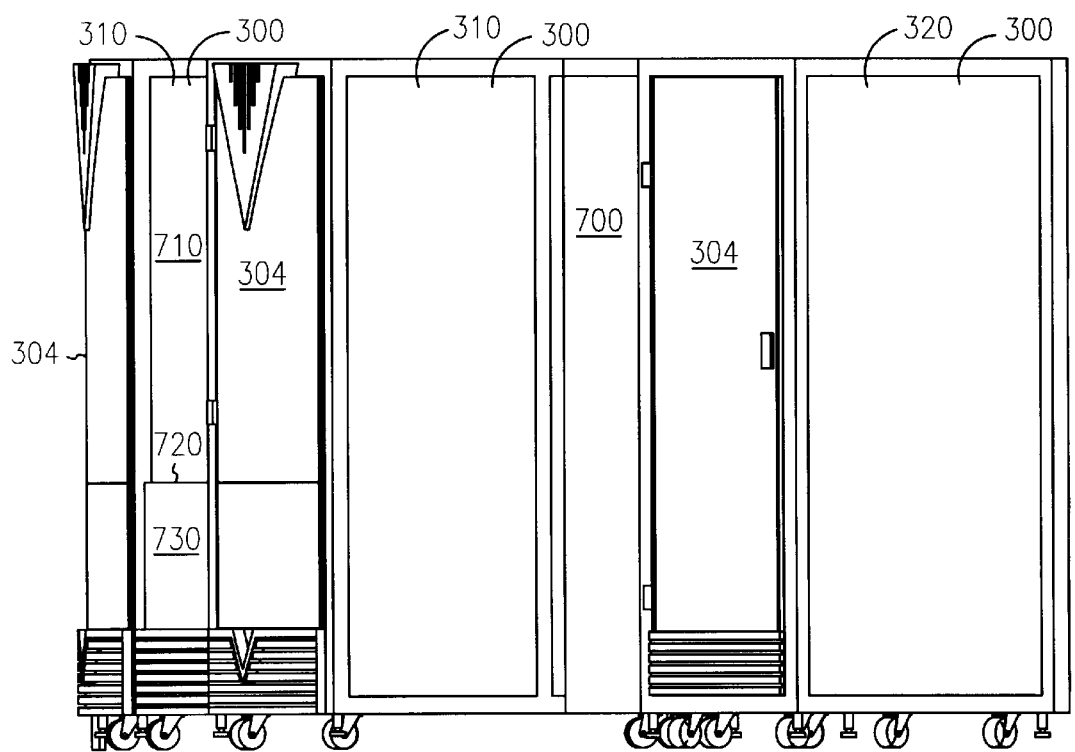
FIG. 14 is a side view of a radial cluster.
Figure 15A:
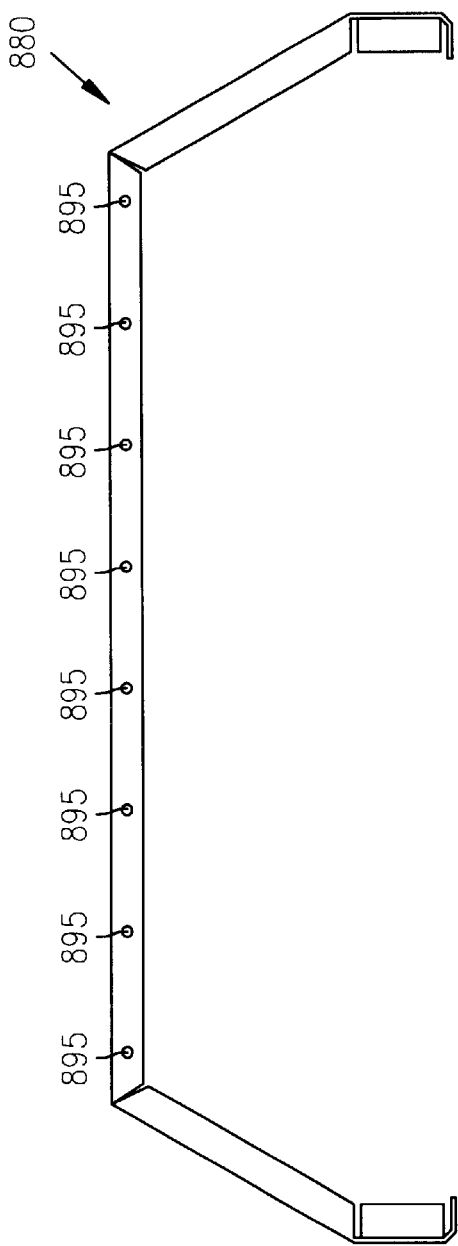
FIG. 15A is a side view of a cable support.
Figure 15B:
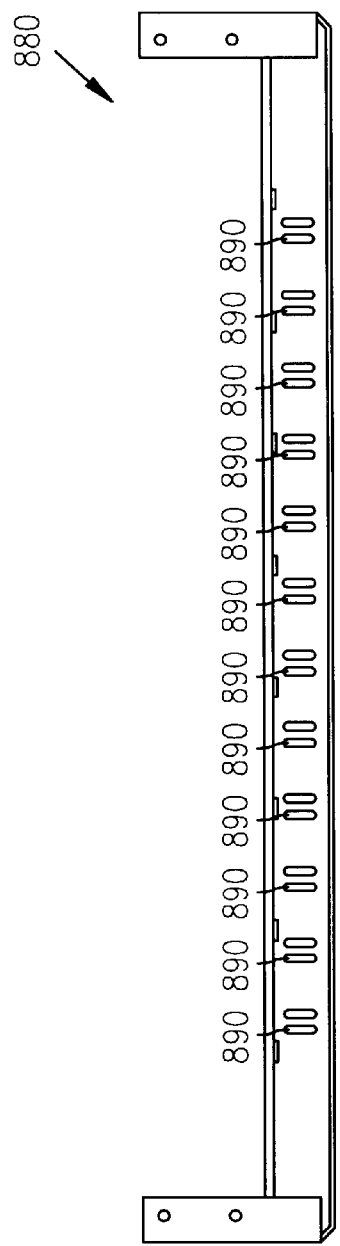
FIG. 15B is a perspective view of a cable support.
Figure 15D:
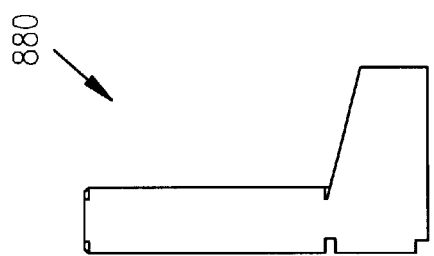
FIG. 15D is a top view of a cable support.
Figure 15C:
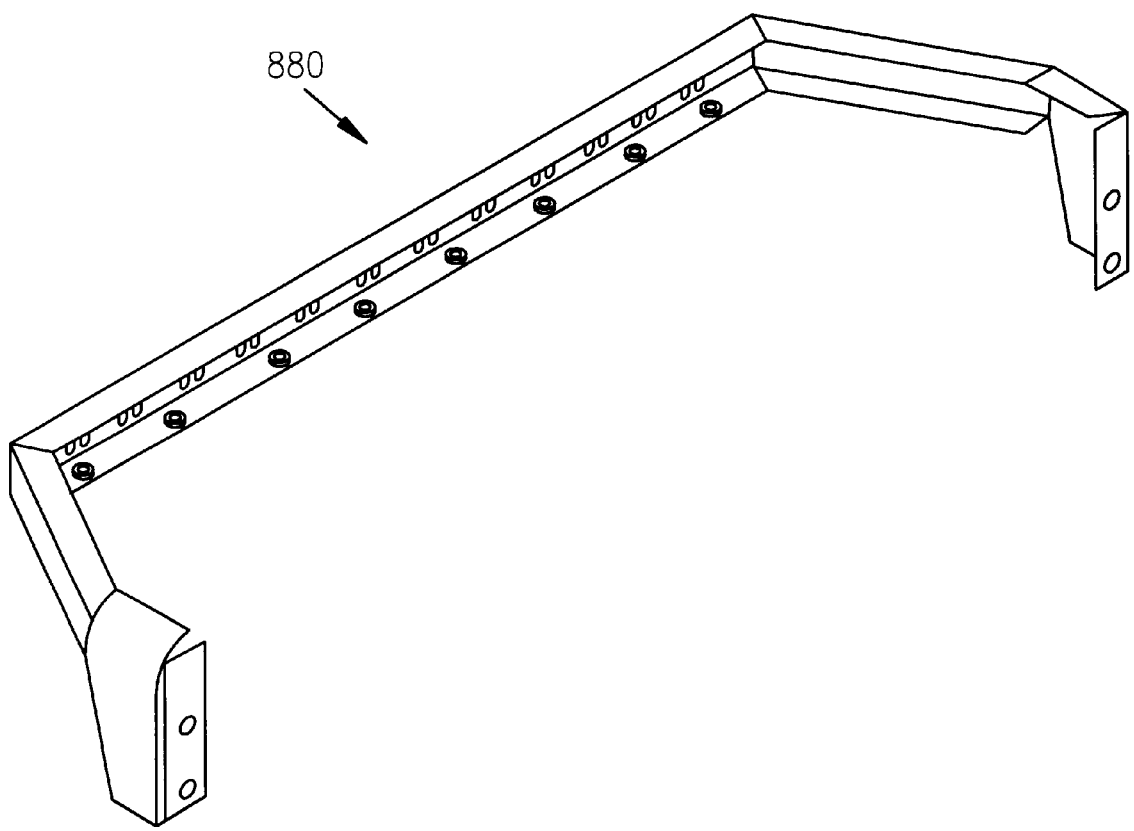
FIG. 15C is a perspective view of a cable support.

FIG. 9 illustrates a front view of an embodiment of a radial cluster 100. FIG. 10 illustrates a top view of an embodiment of a radial cluster 100. FIG. 11 illustrates a rear view of an embodiment of a radial cluster 100. FIG. 12 illustrates a bottom view of an embodiment of a radial cluster 100. FIG. 13 illustrates a side view of an embodiment of a radial cluster 100 and FIG. 14 illustrates a side view of an embodiment of a radial cluster 100.

In one embodiment, the EMI gaskets 910 have a foam core surrounded by a flexible mesh such that the gasket 910 can be compressed between the components upon installation.

The snap-like fit of the various panels provide for improved ease of access to the cable passage 850 and bulkhead 800 for installation, service, upgrade and scaling of the computer system.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. A computer system having a radial configuration comprising:
   a plurality of computer elements, each computer element having a rear face and a front face;
   a plurality of joiners, each joiner having a computer element on each side, the joiners aligning the computer elements such that the computer elements define an arc, the arc having an inner radius defined by the rear face of the computer elements and an outer radius defined by the front face of the computer elements; and
   at least one high frequency cable passing through the joiner between computer elements, the high frequency cable being routed proximal the inner radius of the arc, wherein the computer elements include:
      four processing nodes, each processing node having electromagnetic shielding; and
      two I/O units, wherein the I/O units are electromagnetically isolated from the processing nodes;
      wherein the joiner also includes electromagnetic shielding such that the processing nodes and cable connections within the computer system operates in an EMI tight environment.

2. A computer system having a radial configuration comprising:
   a plurality of computer elements, each computer element having a rear face and a front face;
   a plurality of joiners, each joiner having a computer element on each side, the joiners aligning the computer elements such that the computer elements define an arc, the arc having an inner radius defined by the rear face of the computer elements and an outer radius defined by the front face of the computer elements; and
   at least one high frequency cable passing through the joiner between computer elements, the high frequency cable being routed proximal the inner radius of the arc,
   wherein each computer element includes a rear access door, the computer elements arranged such that the rear access doors swing open without interfering with the adjacent access door.

3. A computer system having a radial configuration comprising:
   a plurality of computer elements, each computer element having a rear face and a front face;
   a plurality of joiners, each joiner having a computer element on each side, the joiners aligning the computer elements such that the computer elements define an arc, the arc having an inner radius defined by the rear face of the computer elements and an outer radius defined by the front face of the computer elements; and
   at least one high frequency cable passing through the joiner between computer elements, the high frequency cable being routed proximal the inner radius of the arc, wherein each computer element includes a front access door.

4. A computer system having a radial configuration comprising:
   a cluster including:
     a plurality of computer elements, each computer element having a rear face and a front face;
     a plurality of joiners, each joiner having a computer element on each side, the joiners aligning the computer elements such that the computer elements define an arc, the arc having an inner radius defined by the rear face of the computer elements and an outer radius defined by the front face of the computer elements; at least one high frequency cable passing through the joiner between computer elements, the high frequency cable being routed proximal the inner radius of the arc;
   a second cluster placed back-to-back with the first cluster, the first cluster and second cluster allowing for service access between the first cluster and the second cluster and being proximally spaced to reduce the length of cable connections between clusters.

5. A computer system having a radial configuration comprising:
   a first cluster
     a plurality of computer elements, each computer element having a rear face and a front face;
     a plurality of joiners, each joiner having a computer element on each side, the joiners aligning the computer elements such that the computer elements define an arc, the arc having an inner radius defined by the rear face of the computer elements and an outer radius defined by the front face of the computer elements;
     at least one high frequency cable passing through the joiner between computer elements, the high frequency cable being routed proximal the inner radius of the arc;
   a second cluster placed back-to-back with the first cluster, the first cluster and second cluster allowing for service access between the first cluster and the second cluster and being proximally spaced to reduce the length of cable connections between clusters; and
   a third cluster and a fourth cluster, the third cluster arranged back-to-back with the fourth cluster allowing for service access between the third cluster and the fourth cluster, the third and fourth cluster allowing for service access between pairs of clusters and placed proximal the first and second cluster to reduce distance of cable connections between pairs of clusters.

6. A joiner for a radial computer system, comprising:
   a first surface for aligning a first computer element, the first surface having a front end and a rear end, the first surface including at least one passage for aligning with a passage in the first computer element and for allowing passage of a cable between the joiner and the first computer element;
   a second surface for aligning a second computer element, the second surface having a front end and a rear end, the second surface including at least one passage for aligning with a passage in the second computer element and for allowing passage of a cable between the joiner and the second computer element;
   a rear surface joining the rear end of the first surface and the rear end of the second surface;
   a front surface joining the front end of the first surface and the front end of the second surface, the front surface being wider than the rear surface so that the first computer element and second computer element are aligned at an angle relative to one another; and
   a means for attaching the joiner to the first and second computer element.

7. The joiner of claim 6 including an EMI compatible plating on the first side and second side for making contact with an EMI gasket on the side of the first and second computer element.

8. The joiner of claim 6 further comprising:
   at least one front passage on the front surface;
   a panel removably attached to the joiner and covering the front passage, the panel having an inside surface including an EMI gasket; and
   an area surrounding the front passage having an EMI compatible plating in contact with the EMI gasket included on the inside surface of the panel.

9. The joiner of claim 6 wherein the means for attaching the joiner to each element includes:
   at least one flange extending out from the joiner proximal where the first surface meets the rear surface;
   at least one flange extending out from the joiner proximal where the second surface meets the rear surface, the flanges for fitting into corresponding slots in the first and second computer elements; and
   a plurality of apertures on the first and second side of the joiner for use in mechanically fastening the joiner to adjacent computer elements, the apertures aligning with apertures on the computer element when the flange is inserted into the slot.

10. The joiner of claim 6 wherein the joiner height is the height of the first and second computer elements for allowing passage of cables along the length of the first and second computer elements and joiner.

11. The joiner of claim 6 wherein the first computer element and the second computer element extend beyond the front face of the joiner, the hardware further comprising at least one bulkhead for mounting to the side of a computer element, the bulkhead including an enclosed area having:

a portion having a first bulkhead opening;

a main plate mounted over the bulkhead opening, the main plate having a rear portion for receiving at least one first cable and a front portion for receiving at least one corresponding second cable, at least one portion of the main plate having an aperture for allowing connection of the first and second cables, the shape of the aperture corresponding to the shape of the first and second cables connecting at the aperture; and a passage for the first cable to enter the enclosed area of the bulkhead to be received at the rear portion of a plate.

12. The joiner of claim 11 wherein the main plate is removably mounted on the bulkhead such that the main plate can be removed and an alternate main plate attached to the bulkhead.

13. The joiner of claim 11 further comprising:

an EMI gasket around the inside surface of the main plate;

an EMI compatible plated surface around the first bulkhead opening, the gasket of the plate contacting the plated surface around the first bulkhead opening.

14. The joiner of claim 11, the main plate further comprising:

a portion having a plurality of main plate openings;

a plurality of smaller plates removably attached to the main plate covering the main plate openings, the smaller plates for receiving at least one first cable on the rear portion of the smaller plate and at least one second cable on the front portion of the smaller plate, each smaller plate having at least one portion having an aperture for allowing connection of the first and second cables, the shape of the apertures corresponding to the shape of the first and second cables connecting at the aperture.

15. The joiner of claim 14 further comprising:

an EMI gasket around the inside surface of the smaller plate;

an EMI compatible plated surface around the main plate opening, the gasket of the smaller plate contacting the plated surface around the main plate opening.

16. The joiner of claim 11 further comprising a cable support frame connected to the bulkhead.

17. The joiner of claim 16 wherein the support frame is within the enclosed portion of the bulkhead for supporting at least one first cable.

18. The joiner of claim 16 wherein the support frame is on the outer portion of the bulkhead for supporting at least one second cable.

19. The joiner of claim 11 further comprising a side cable panel mounted over the bulkhead cable passage and over the first cables to enclose the first cables and to provide EMI shielding.

20. The joiner of claim 11, the bulkhead further comprising:

a second enclosed area for housing cooling hardware;

a passage for allowing cooling hardware to enter the enclosed area;

a second bulkhead opening; and a cooling hardware access plate removably attached to the bulkhead and covering the second bulkhead opening, the plate removable for providing access to cooling hardware.

21. The joiner of claim 11 wherein the bulkhead is about half the height of the joiner.

22. The joiner of claim 11 further comprising:

a first seat access panel; and a second seat access panel, the first seat access panel and second seat access panel for enclosing the bulkhead, the first seat access panel abutting the joiner access panel, the side cable panel, and the second seat access panel.

23. A method for clustering a scalable computer system to reduce high frequency cable lengths and to provide scalable cable connection hardware, the method comprising:

aligning a plurality of computer elements radially so that the computer elements form an arc with an inner radius and an outer radius, the alignment creating increased space between the computer elements toward the outer radius of the arc;

connecting joiners between the plurality of computer elements;

electrically connecting the plurality of computer elements, wherein electrically connecting includes routing high frequency cables through the elements and radial joiners proximal the inner radius of the arc; and connecting bulkheads to the plurality of computer elements such that the bulkhead is distal from the inner radius of the arc but within the outer radius of the arc, the bulkhead having:

a plate for receiving at least one first cable on one side of the plate and for receiving at least one corresponding second cable on the other of the sides of the plate; and a plate aperture for allowing connection of the first cable and second cable, the plate including an EMI gasket and the bulkhead including an EMI compatible plating, the gasket contacting the plating; and an enclosed area for receiving the first cable and an EMI tight passage for allowing the first cable to enter the enclosed area of the bulkhead.

24. A method for clustering a scalable computer system to reduce high frequency cable lengths and to provide scalable cable connection hardware, the method comprising:

aligning a plurality of computer elements radially so that the computer elements form an arc with an inner radius and an outer radius, the alignment creating increased space between the computer elements toward the outer radius of the arc;

connecting joiners between the plurality of computer elements;

electrically connecting the plurality of computer elements, wherein electrically connecting includes routing high frequency cables through the elements and radial joiners proximal the inner radius of the arc; and connecting a bullhead having a second enclosed area within the bulkhead;

routing cooling hardware into the enclosed area through a portion of the bulkhead having a passage for receiving the cooling hardware;

accessing the cooling hardware through a second opening in the bulkhead through a removable access plate over a second opening.

25. A method for clustering a scalable computer system to reduce high frequency cable lengths and to provide scalable cable connection hardware, the method comprising:

aligning a plurality of computer elements radially so that the computer elements form an arc with an inner radius and an outer radius, the alignment creating increased space between the computer elements toward the outer radius of the arc;

connecting joiners between the plurality of computer elements, wherein connecting includes connecting the joiners between centrally located processing nodes and between a processing node and an I/O unit on each side of the computer system; and electrically connecting the plurality of computer elements, wherein electrically connecting includes routing high frequency cables through the elements and radial joiners proximal the inner radius of the arc.

26. A method for clustering a scalable computer system to reduce high frequency cable lengths and to provide scalable cable connection hardware, the method comprising:

aligning a plurality of computer elements radially so that the computer elements form an arc with an inner radius and an outer radius, the alignment creating increased space between the computer elements toward the outer radius of the arc;

connecting joiners between the plurality of computer elements, wherein connecting includes shielding the computer elements and the joiners to provide an EMI tight environment; and electrically connecting the plurality of computer elements, wherein electrically connecting includes routing high frequency cables through the elements and radial joiners proximal the inner radius of the arc.

* * * * *